United States Patent [19]

Goodman

[11] 4,333,051

[45] Jun. 1, 1982

[54] METHOD AND APPARATUS FOR DETERMINING MINORITY CARRIER DIFFUSION LENGTH IN SEMICONDUCTORS

[75] Inventor: Alvin M. Goodman, Princeton, N.J.

[73] Assignee: RCA Corporation, New York, N.Y.

[21] Appl. No.: 153,920

[22] Filed: May 28, 1980

[51] Int. Cl.$^3$ .............................................. G01R 31/26
[52] U.S. Cl. ............................. 324/158 R; 324/158 D
[58] Field of Search ........... 324/158 D, 158 R, 158 T, 324/73 R

[56] References Cited

U.S. PATENT DOCUMENTS 3,939,415  2/1976  Terasawa ........................ 324/158 D
4,051,437  9/1977  Lile et al. ........................ 324/158 D

OTHER PUBLICATIONS

Goodman, A. M., "A Method for the Measurement...", J. of Applied Physics; vol. 32; No. 12, Dec. 1961; pp. 2550-2552.
ANSI/ASTM F391-78; "Minority Carrier...", American National Standard; Sep. 1978; pp. 770-776.
Model 100 Manual; Solar Semiconductor Instruments, Garland, Texas; 10 pages; (no date).

Primary Examiner—Ernest F. Karlsen
Attorney, Agent, or Firm—Birgit E. Morris; Donald S. Cohen; Joseph D. Lazar

[57] ABSTRACT

Method and apparatus are provided for determining the diffusion length of minority carriers in semiconductors using the constant-magnitude surface-photovoltage (SPV) method. A servo system maintains a constant predetermined value of the SPV. A novel capacitance-pickup electrode couples the SPV to a preamplifier in the measurement system and functions to reduce SPV drift. A keyboard or computer is used to select both the operating optical wavelength of an adjustable monochromator and a network to compensate for the wavelength dependent sensitivity of a photodetector used to measure the illumination intensity (photon flux) on the semiconductor. Measurements of the relative photon flux for a plurality of wavelengths are plotted against the reciprocal of the optical absorption coefficient of the material. A linear plot of the data points is extrapolated to zero intensity. The negative intercept value on the reciprocal optical absorption coefficient axis of the extrapolated linear plot is the diffusion length of the minority carriers.

25 Claims, 6 Drawing Figures

METHOD AND APPARATUS FOR DETERMINING MINORITY CARRIER DIFFUSION LENGTH IN SEMICONDUCTORS

This invention relates to an apparatus for determining the minority carrier diffusion length in semiconductors using the constant-magnitude surface-photovoltage (SPV) method.

BACKGROUND OF THE INVENTION

Apparatus and methods for determining the minority carrier diffusion length (L) using the SPV method are well known. In brief, the principle of the diffusion length (L) determination requires the illumination of a specimen surface with monochromatic radiation of energy slightly greater than the bandgap of the semiconductor. Electron-hole pairs are produced and diffuse to the illuminated (front) surface where they are separated by the electric field of the depletion region (i.e., the surface-space-charge region) to produce a surface photovoltage (SPV). A portion of the SPV signal is coupled to an amplifier for amplification and measurement. The photon intensity (photons per second) is adjusted to produce the same magnitude of SPV at various wavelengths of illumination. The photon intensity required to produce this constant magnitude SPV signal is conveniently plotted on the ordinate against the reciprocal of the absorption coefficient on the abscissa for each wavelength. The resultant plot is linear and is extrapolated to the zero intensity intercept on the negative abscissa. This intercept value is the effective diffusion length (L). For a more detailed description of the theory and background for this method, see my article "A Method for the Measurement of Short Minority Carrier Diffusion Lengths in Semiconductors," in the *Journal of Applied Physics*, Vol. 32, No. 12, pp. 2550–2552, December 1961. The American Society for Testing and Materials has adopted a standard using this method which is published as ASTM F 291-78. The ASTM standard, when implemented according to the block diagram of FIG. 1 of ASTM F 291-78, is provided particularly for testing the diffusion length (L) for minority carriers in silicon but the method may be used for other semiconductor materials. This ASTM method will be discussed further hereinafter.

Equipment is available for carrying out the measurements to determine the diffusion length described above. One such equipment is manufactured by Solar Semiconductor Instruments, of Garland, Texas as the SSI Model 100 diffusion length meter. However, the known equipments are deficient in one or more ways that make their use difficult and time consuming. Each of these known equipments requires manual wavelength selection such as using a manually operated monochromator or a filter wheel and the manual adjustment of the light level by the operator at each wavelength to achieve a constant-magnitude SPV. Another problem is the low signal-to-noise (SNR) ratio of the surface photovoltage that is produced by such equipment.

In the pickup arrangement used in the prior art, the minority carriers generated in the illuminated region of the sample slowly diffuse to the nonilluminated region of the surface and there change the surface properties. The capacitance of the nonilluminated region of the surface is slowly changed thereby. The change in capacitance presents a time-varying attenuation to the ac portion of the generated surface photovoltage (SPV) that is coupled to an amplifier, thereby producing the observation of drift of the measured portion of the surface photovoltage with time. This drift effect results in making difficult the determination of the minority carrier diffusion length (L). Significant drifting during the course of the measurements will make it impossible to determine L.

SUMMARY OF THE INVENTION

According to the present invention, an apparatus for determining the diffusion length of minority carriers is provided to illuminate the surface of a semiconductor device with monochromatic light to generate a constant magnitude surface photovoltage (SPV) that is independent of variations in the wavelength of illuminating light and to measure the relative intensity of the incident illumination.

DETAILED DESCRIPTION OF THE DRAWING

Figure 2:
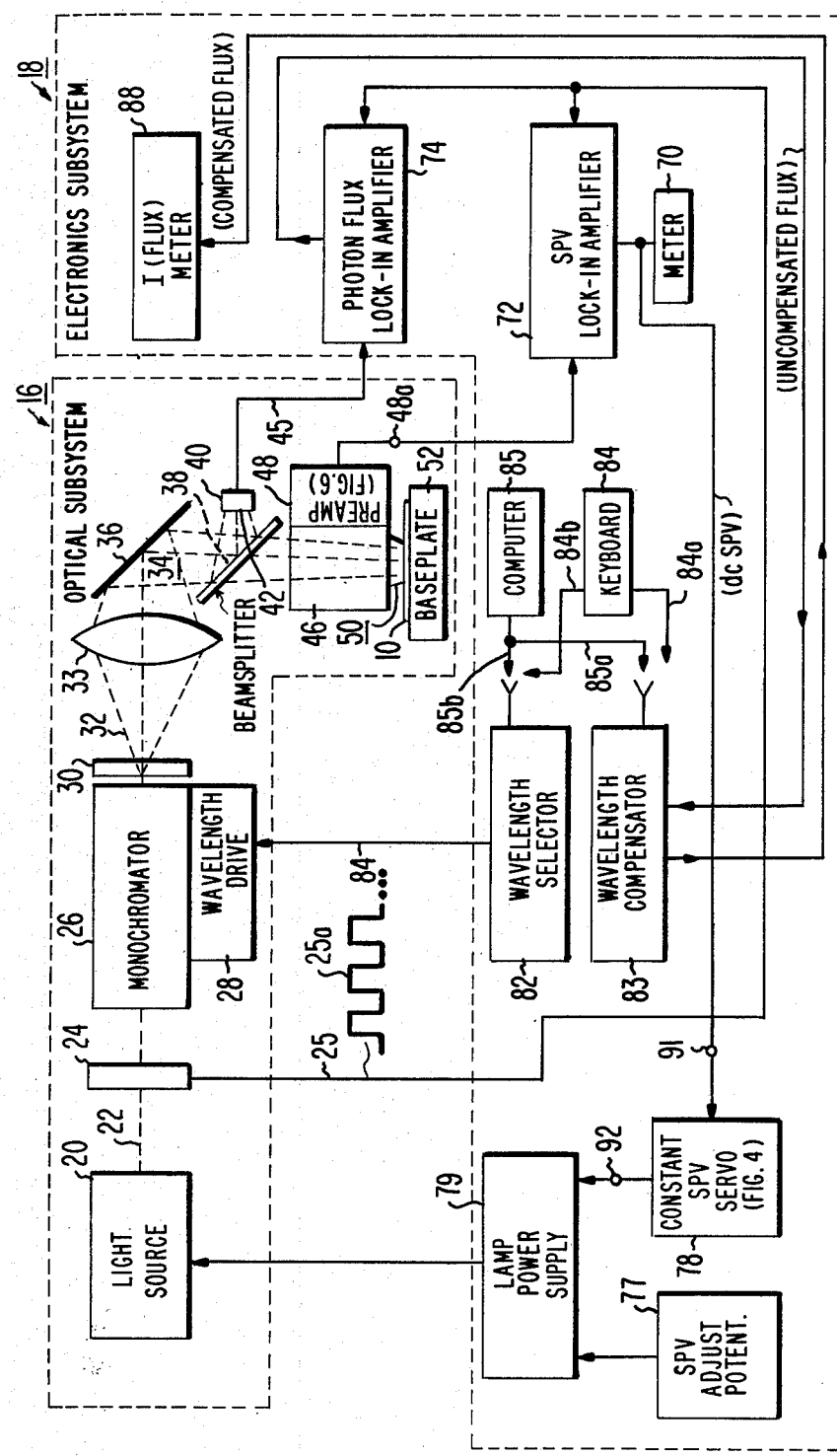
FIG. 2 is a block schematic of an apparatus constructed according to the teachings of the invention.

The measuring apparatus of the invention as illustrated in FIG. 2, to be described, provides a means using the constant-magnitude surface photovoltage (SPV) method for determining the minority carrier diffusion length (L) in a semiconductor of the type that will be defined. In the embodiment to be described, the wafer for which the diffusion length is to be measured is a silicon wafer. Nevertheless, the invention, it is to be understood, can be used to determine the diffusion length of minority carriers in such semiconductor material, provided the thickness of the semiconductor material wafer being tested is at least greater than the diffusion length of the minority carrier and preferably four times that diffusion length. Such semiconductor material includes, but is not necessarily limited to, silicon, germanium, gallium arsenide and indium phosphide.

Figure 1:
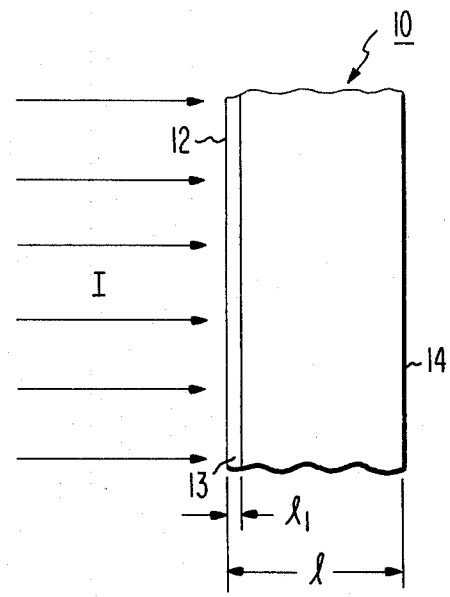
FIG. 1 is a schematic illustrating the geometric parameters of a semiconductor specimen useful in understanding and practicing the invention.

The geometry of a specimen wafer 10 is illustrated in FIG. 1. Wafer 10 is assumed to be in the form of a semiconductor slab. One surface 12 is uniformly illuminated by chopped monochromatic light of photon energy $h\nu$, slightly greater than the bandgap ($E_G$) of the semiconductor material, while the opposite surface 14 is kept dark. Electron hole pairs are produced by the absorbed photons. Some of these pairs diffuse to the illuminated surface 12 where they are separated by the electric field of the depletion or surface-space-charge region 13, thereby producing a surface photovoltage (SPV). A portion of the SPV is capacitively coupled to a transparent conducting electrode (not shown in FIG. 1, but shown in FIGS. 2 and 3 to be described) adjacent to the illuminated face. This portion of the SPV is then amplified and rectified to provide a substantially d.c.

output voltage. This output voltage is an analogue that is proportional to the SPV. This output voltage for convenience shall be termed hereinafter the d.c. SPV.

The measured quantity is the surface photovoltage of the semiconductor. The surface photovoltage (i.e. SPV) developed at the illuminated surface 12 is a function of the excess minority carrier density $\Delta p$ injected into the surface space charge region 13. The density $\Delta p$ is in turn dependent upon the incident light intensity (photon flux) I, the optical absorption coefficient $\alpha$ and the diffusion length L. The diffusion length may then be determined by measuring the variation of I with $\alpha$ (i.e. with wavelength $\lambda$) at a constant value of SPV. An accurate knowledge of $\alpha$ as a function of $\lambda$ is required.

It can be shown that a steady state solution of the one dimensional diffusion equation for the sample geometry illustrated in FIG. 1 is:

$$\Delta p = \frac{\eta I(1-\rho_1)}{(D/L)+s} \cdot \frac{\alpha L}{1+\alpha L} \quad (1)$$

assuming that $$\alpha l \gg 1, \quad (2a)$$
$$\alpha l_1 \ll 1, \quad (2b)$$
$$l \gg L, \quad (2c)$$
$$l_1 \ll L, \quad (2d)$$
$$\Delta p \ll n_0, \quad (2e)$$

where $\eta$ is the photon quantum efficiency for hole-electron pair creation, $\rho_1$ is the optical reflection coefficient at the illuminated surface, s is the surface recombination velocity at the illuminated surface 12, l is the sample thickness, $l_1$ is the depth of the space charge layer at the illuminated surface, and $n_o$ is the majority carrier density.

The surface photovoltage may be written as $$(SPV) = f[\Delta p] = f\left[\frac{\eta I(1-\rho_1)}{(D/L)+s} \cdot \frac{\alpha L}{1+\alpha L}\right] \quad (3)$$

where the form of the functional dependence need not be known explicitly. $\Delta V$ (SPV) is actually measured between a capacitive probe at the illuminated surface and one at the unilluminated surface. It is therefore necessary that the surface photovoltage developed at the unilluminated surface be negligible. Equations (2a) and (2c) assure that this may be achieved in any practical case. The functional dependence will vary from one sample to another depending on the type of semiconductor, doping, surface treatment, etc. If $\rho_1$ and $\eta$ are essentially constant over the $\alpha$ region of interest, Eq. (3) may be rewritten as $$(SPV) = f[CI\alpha/(1+\alpha L)], \quad (4)$$

where C is a constant. Although the specific form of this relationship may not be known, it is a monotonic function and may therefore be inverted to give $$I\alpha/(1+\alpha L) = F(SPV) \quad (5)$$

The same value of (SPV) may be obtained for two different values of I (perhaps $I_1$ and $I_2$) provided that the corresponding values of $\lambda$ and hence $\alpha(\alpha_1$ and $\alpha_2)$ are properly chosen. It follows in this case from Eq. (5) that $$I_1\alpha_1/(1+\alpha_1 L) = I_2\alpha_2/(1+\alpha_2 L). \quad (6)$$

Thus L may be obtained as $$L = [I_2\alpha_2 - I_1\alpha_1]/[\alpha_1\alpha_2(I_1-I_2)]. \quad (7)$$

Figure 5:
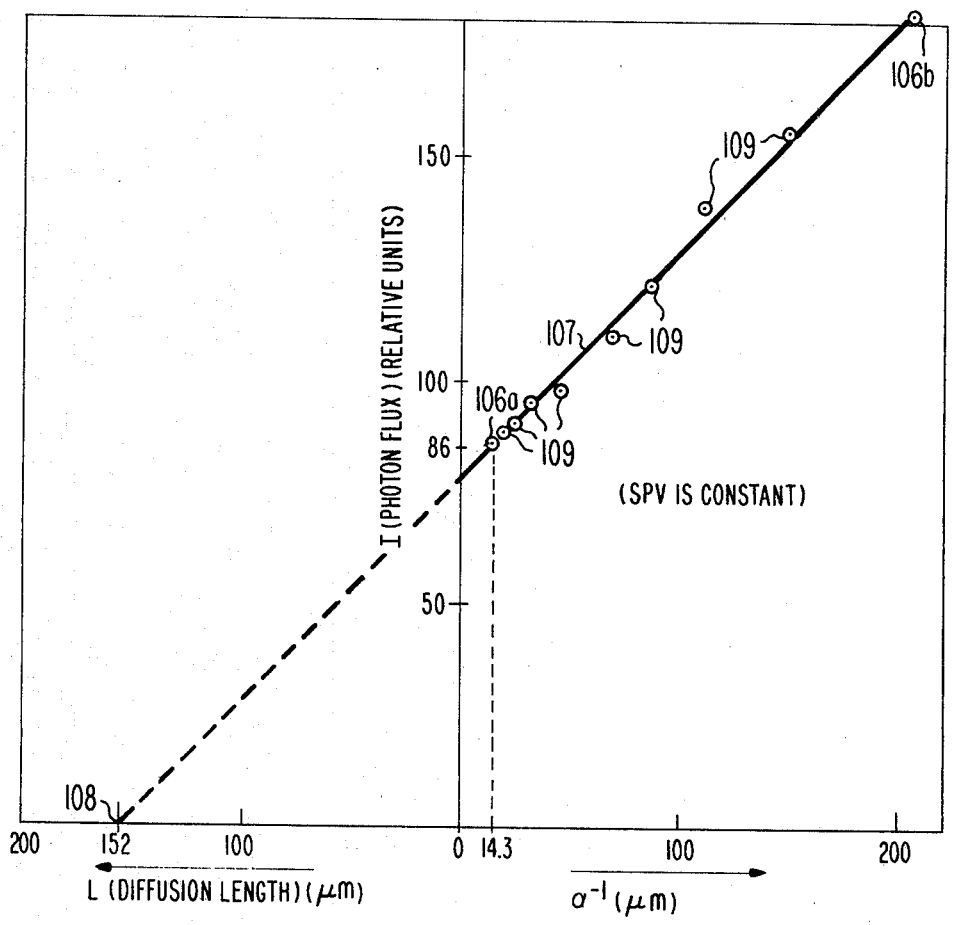
FIG. 5 is a plot of relative light intensity versus reciprocal optical absorption coefficient.

The magnitude of the SPV depends on both the optical absorption coefficient $\alpha$ (cm$^{-1}$) and the photon flux I (photons $-$cm$^{-2}-$sec$^{-1}$). A series of different wavelength ($\lambda$) values is selected to give different values of the absorption coefficient $\alpha$. At each value of the wavelength $\lambda$, the flux I is adjusted to give the same value of the d.c. SPV, that is, a constant magnitude of the d.c. SPV. If I is plotted against the reciprocal of the absorption coefficient ($\alpha^{-1}$) for each of these constant magnitude d.c. SPV points, the result is a linear graph whose extrapolated intercept on the negative reciprocal absorption coefficient axis is the effective diffusion length (L). An example of such a graph is illustrated in FIG. 5 to be described further hereinafter. As indicated in equation (2c) above the thickness of the material 1 must be much greater than the diffusion length L. In practice, a material thickness (l) of at least four times the diffusion length (L) is preferred although the invention provides practical measurements for material of thicknesses between two and four times L.

The apparatus for carrying out these measurements to determine the diffusion length (L) according to the invention, as shown in FIG. 2, is formed of an optical subsystem 16 and an electronic subsystem 18. The optical subsystem 16 is formed of a light source 20 for providing a spectrum of light that will include at least the desired wavelengths that are to be used for the determination of the diffusion length (L) by measuring the intensity of illumination incident upon the sample. The measured intensity of illumination is used to determine the diffusion length (L) by the known relationship of the reciprocal of the absorption coefficient ($\alpha^{-1}$) as is shown in the plot of FIG. 5.

The light source 20 provides a beam 22 which is periodically interrupted by a light chopper 24 at one frequency typically within the range of 10-600 Hz and applied to preferably a double grating monochromator 26 having suitable means for changing the wavelength to any one of a preselected set of wavelengths. Such a mechanism is provided by wavelength drive 28 having means to rotate the diffraction grating in incremental steps to change the wavelength thereby.

Monochromator 26 in general may be of the prism type or grating type. The grating type is preferred because of the greater intensity of light that is provided at a selected wavelength. Furthermore, the double grating type is preferred since it provides, in addition to the higher intensity of light over the prism type that is more pure spectrally over the single grating type. Furthermore, the wavelength provided by the monochromator must be selectable. Accordingly, the wavelength drive 28 is provided to change the wavelength of the monochromator automatically in a manner to be described hereinafter.

The monochromator 26 provides a monochromatic light of a selected wavelength which is passed through a second order filter 30. The second order filter 30 serves to reduce to a negligible level the intensity of the second order diffracted beams that may pass through the grating type monochromator 26. (Such a filter is not needed for a prism-type monochromator.) The beam 32 from the monochromator after being filtered is passed through a focusing lens 33 which is arranged to focus a beam on the sample 10. The focused beam is reflected by mirror 36 which reflects the beam to a beam splitter 38 which passes a portion of the beam through a housing 46 and onto the specimen 10 after passing through an SPV electrode support 50. A detailed description of the support 50 will be described in conjunction with the detailed sketch shown in FIG. 3. The specimen 10 rests on a base plate 52.

Another portion of the beam reflected from mirror 36 is reflected by beam splitter 38 onto the active or front surface 42 of a photodiode 40. Photodiode detector 40 is suitably a silicon or germanium diode having sufficient active surface to sample all of the beam 34 reflected from the beam splitter 38. A voltage representing the incident light on the photodiode 40 is carried therefrom via a conducting path 45 to a lock-in amplifier 74 within the electronic subsystem 18.

Incident light 34 has a photon flux I of relative units. This flux illuminates the specimen 10 and causes a surface photovoltage (SPV). The a.c. components of the SPV are detected by a capacitance pickup arrangement (shown in FIG. 3 to be described) for amplification by a preamplifier 48 shown in detail in FIG. 6. The output of preamplifier 48 is an amplified version of the SPV and is applied to the input of a lock-in amplifier 72. Amplifier 72 is a suitable lock-in amplifier synchronized to the frequency of a reference signal $25a$ having one frequency typically within the range of 10 to 600 Hz corresponding to the frequency of the interrupted light developed by light chopper 24. The synchronizing signal $25a$ is carried to amplifier 72 via path 25. Synchronizing signal $25a$ is also applied to lock-in amplifier 74 to synchronize the signal from the photodetector 40.

The d.c. SPV is applied to a meter 70 for displaying the magnitude of the d.c. SPV. The d.c. SPV is also applied as an input to the constant SPV servo 78 shown in more detail in FIG. 4 to be described. The servo 78 serves to maintain the d.c. SPV at a substantially constant value. The servo 78 accomplishes this by a control signal to the lamp power supply 79 which in turn provides the power for light source 20. In brief, any deviation in the dc SPV voltage from a predetermined value as sensed by the servo 78 results in the light source 20 being changed in intensity to compensate for the d.c. SPV deviation. The manner in which this is accomplished will be described in greater detail hereinafter with the description of FIG. 4.

The output signal of the lock-in amplifier 74 is applied to a wavelength compensator network 83 which compensates for changes in sensitivity of the photodiode detector 40 due to changes in wavelength and provides thus a wavelength compensated output signal to a photon flux (I) meter 88. This wavelength compensated output signal represents the photon flux (I) used to determine the diffusion length L by the use of the graph shown in FIG. 5. Wavelength compensator network 83 is a suitable network of potentiometers each of which provides a predetermined voltage ratio (or attenuation) corresponding to a preselected wavelength used in determining the illumination intensity of the photon flux I. During the measurements for each preselected wavelength of light from monochromator 26, the potentiometer of network 83 corresponding to the selected wavelength corrects the output signal from amplifier 74. This corrected output signal is applied to meter 88 as the wavelength compensated photon flux (I) of the incident light on the specimen 10.

A keyboard 84 is provided with a suitable set of keys, switches, or the like, for manual selection by the operator of a given preselected wavelength of light to be used for each measurement. Operation of the keyboard 84 provides a control signal via path $84a$ to network 83 as well as a control signal to wavelength selector 82 via path $84b$. Accordingly, for each selected wavelength, network 83 provides a signal to compensate for the wavelength dependent response characteristic of the photodiode detector 40 due to different wavelengths.

The selection of the wavelength by keyboard 84 also energizes a suitable wavelength selector 82 for actuating the wavelength drive 28. Drive 28 is of suitable form, such as a stepping motor, which rotates the grating mechanism of monochromator 26 through a suitable drive arrangement to a predetermined position corresponding to the selected wavelength.

In the alternative, a microprocessor or computer 85 may be provided to select automatically each of the wavelengths for a given programmed series of measurements and at the same time energize the compensation network 83 to compensate the output of photodiode 40 to the normalized value corresponding to the selected wavelength for display on meter 88. To do this, computer 85 provides control voltages to network 83 and selector 82 via paths $85a$ and $85b$, respectively.

Figure 3:
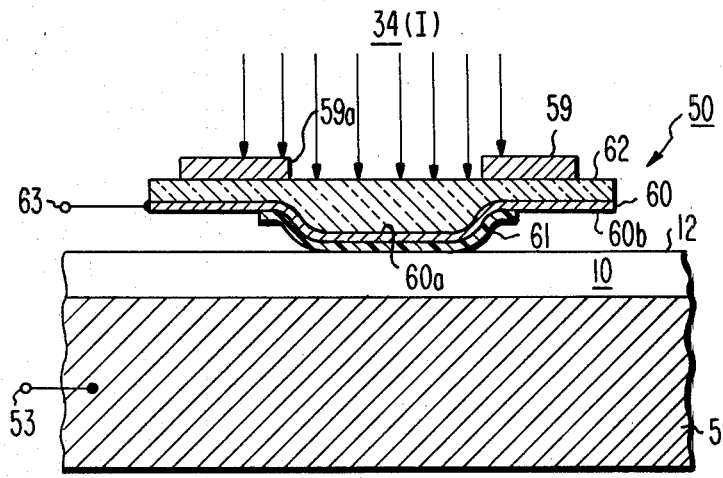
FIG. 3 is a schematic of a specimen holder and capacitive electrode pickup useful in the practice of the invention.

Reference is now made to FIG. 3 which illustrates the capacitance pickup arrangement for sensing the SPV and for supporting the specimen 10 during the measurement process. A conducting base plate 52 formed of suitable conducting metal supports on its upper surface, a specimen wafer 10 for testing. A capacitive pickup electrode 60 formed of transparent conducting material is supported in spaced relation above the surface of the specimen 10 by an insulating layer 61 of dielectric material. A transparent member 62 formed of glass or quartz is suitably coated with a material to form the conducting electrode 60. A mask member 59 provided with an aperture $59a$ is placed on the upper surface of the transparent member 62. The electrode 60 is shaped with a protruding portion $60a$ positioned under aperture $59a$. Portion $60a$ is thus spaced closer to the surface 12 of specimen 10 than the remaining portion $60b$. The area of surface portion $60a$ is not greater than but nearly the same as the area defined by the aperture $59a$ of the member 59. The electrode portion $60a$ is spaced from the specimen 10 to provide an insulating gap therebetween. Preferably, a dielectric insulating layer 61 is provided in this space to thereby establish a relatively large capacitance value for a capacitor defined by the electrode portion $60a$ and body of the semiconductor specimen 10. The semiconductor material of specimen 10 is sufficiently conductive for the purpose of serving as an electrode for the capacitor. An electrode terminal 63 is provided on the electrode 60 and a terminal 53 is provided on base plate 52.

In one illustrative embodiment, the transparent conducting coating for electrode 60 of about 2000 Angstroms is formed of indium tin oxide (ITO) formed of 80% $SnO_2$ and 20% $In_2O_3$. This electrode is transparent to light throughout the wavelength region of interest. The transparent member 62 is formed of quartz. The insulating layer 61 is also transparent to light and is typically 2000 Angstroms in thickness and may be formed of a combination of silicon dioxide, aluminum oxide, or silicon nitride or any stable transparent sprayed-on coating such as Krylon acrylic spray. The entire assembly 50 of the electrode carrier is supported with a suitable spring-loaded mechanism in the housing 46. The base plate 52 may also be supported on a resilient or spring-loaded foundation so that the specimen 10, when placed on the base plate 52, will be subject to resilient pressure contact by the electrode carrier 50 pressing against the surface of the specimen 10 resting on the base plate 52.

The SPV voltage developed on the surface of the specimen 10 when exposed to illumination (I) 34 is alternating between zero and a maximum value at the frequency of the light chopper 24, typically in the range of 10 to 600 Hz. In a preferred form of the invention, a value of 169 Hz was used for the light chopping frequency. The illumination must be chopped, it will be noted, in order to develop an alternating SPV for coupling by the capacitor defined by the electrode 60a and the specimen 10. The alternating SPV is developed across terminals 63 and 53 which are connected with the shortest possible leads to preamplifier 48 mounted on housing 46. A suitable preamplifier is shown in detail in FIG. 6, which will now be described.

Figure 6:
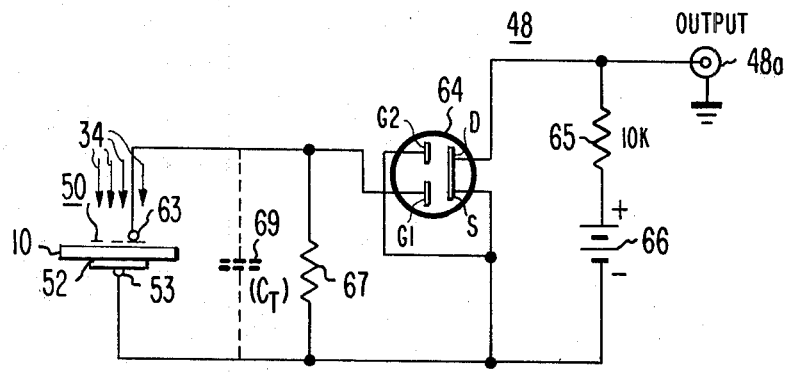
FIG. 6 is a schematic of the preamplifier (48) shown in FIG. 2.

The specimen 10, as shown in FIG. 6, when exposed to the light 34, develops an a.c. voltage across terminals 63 and 53 which are connected to the first gate (G1) and source (S) respectively of a dual gate FET 64. A second gate (G2) of the FET 64 is connected directly to the source (S). The drain (D) is connected serially through a resistor 65, a d.c. power supply 66 and then back to the source (S) and gate (G2) terminals. A shunting resistor 67, typically having a value of $10^9$ ohms, is used to provide a high impedance at the input to the FET 64. A typical FET for this preamplifier circuit 48 is an RCA type 40673 FET. Capacitor 69, shown in dotted line, represents the total input shunting capacitance ($C_T$) as seen at the input to FET 64. $C_T$ represents the capacitance defined between the electrode 60 and the semiconductor specimen 10 as well as the distributed capacitances defined by the leads from terminals 63 and 53 to the input electrodes of the FET 64.

When the light 34 passes through the aperture 59a and onto the surface 12 of the specimen 10 under the protruding portion 60a of the electrode 60, an instantaneous peak value of SPV signal is generated on the surface. Within a period of typically five to fifteen minutes, the peak value of the portion of the SPV applied to amplifier 48 is increasingly attenuated as the minority carriers diffuse from the region of high minority carrier concentration under the illuminated portion radially outwardly to the peripheral non-illuminated region of low minority carrier concentration of specimen 10. This SPV attenuation phenomenon is a problem that makes an accurate determination of minority carrier diffusion length difficult. The SPV attenuation is caused by the gradual increase of the effective total capacitance of a conventional pickup electrode as the minority carriers drift from the illuminated area portions. According to this invention, any increase in capacitance due to outward carrier diffusion is reduced by providing a relatively large air gap between the electrode portions 60b and the surface 12 of the specimen not being illuminated. The portions of the capacitance of the total capacitance ($C_T$) that are contributed by the electrode portions with an air gap dielectric as compared to the portion comprising the protruded electrode portion 60a and the large dielectric 61 will thus be quite low and substantially insignificant. Thus, the effect of outward or radial diffusion of minority carriers is reduced. In some specimens, nevertheless, the time for which the stabilization of the minority carrier movement is established can be quite long.

According to the present invention, the SPV signal can be determined rapidly and thereby allow for measurements used to determine the diffusion length L even while the d.c. SPV signal is drifting from a peak value towards a steady state value. Such drifting can vary appreciably in the amount of time it can take. In a typical testing condition, the SPV voltage developed across the surface space charge region 13 of the sample 10 may be in the order of 200 microvolts while the voltage developed at the output terminal 48a of the preamplifier 48 may be in the order of 10 microvolts.

It is important that the electrical conduction path between terminal 63 and 53 to the input terminals of the preamplifier FET 64 be as short as possible, in order to minimize the reduction in signal-to-noise ratio (SNR) and to also minimize the introduction of excessive distributed capacitance included in the input capacitor 69.

Figure 4:
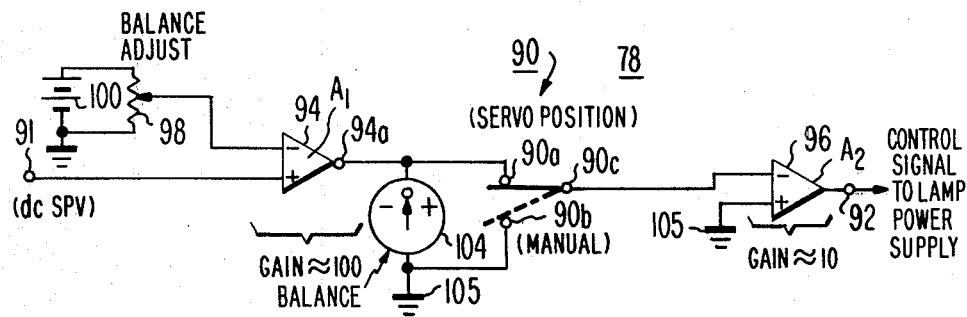
FIG. 4 is a simplified schematic of the servo portion of the apparatus shown in FIG. 2.

Reference is now made to FIG. 4 in which the constant SPV servo 78 is shown in a simplified schematic. SPV servo 78 comprises a first operational amplifier 94 and a second operational amplifier 96. The first amplifier 94 is provided with a lead from terminal 91 for carrying the d.c. SPV from the lock-in amplifier 72 to the positive input terminal of amplifier 94. The negative input terminal of amplifier 94 is connected to a potentiometer 98 and in turn connected to a regulated d.c. source 100. A balance meter 104 is connected between the output terminal 94a of amplifier 94 and ground 105. The output terminal 94a of amplifier 94 is also connected to terminal 90a of a single-pole, double-throw switch 90. The switch 90 as shown is connected from terminal 90a through the common terminal 90c. The terminal 90b of switch 90 is connected to ground 105. Switch position 90a as shown is positioned for automatic servo operation. Position 90b is the manual position in which the servo is balanced for the predetermined SPV voltage. Switch terminal 90c is connected to the negative input terminal of amplifier 96, while the positive input terminal is connected to ground 105. The output terminal 92 of amplifier 96 is connected to lamp supply 79, which in response to a control signal from servo 78 adjusts the power being provided to the light source 20. Lamp supply 79 is current-limited to a predetermined value to prevent burn-out of the light source 20. Typically, the gain of amplifier 94 is in the order of 100, whereas the gain of amplifier 96 is in the order of 10. Accordingly, for an input d.c. SPV of $10^{-3}$ volts, an output voltage at terminal 92 of about one volt will be generated. With the switch 90 in position 90b, potentiometer 98 is adjusted to provide a zero or balanced reading on meter 104. Servo 78 functions to maintain during the measurements of the specimens a preselected value of the d.c. SPV.

The operation of the apparatus will now be described. A specimen 10 is initially prepared for the measurement of the SPV and photon flux I by, for example, treating the surface with a suitable etching solution to obtain an adequate SPV signal and remove any damaged surface layer. See the above identified ASTM F 391-78 Paragraph 9, for a further description of the manner of preparing the specimen.

The apparatus is placed in operation for measuring the SPV of the specimen 10 by operating the SPV adjustment potentiometer 77 (FIG. 2) to thereby power the light source 20 via power supply 79 for illumination of the specimen 10 in testing position on the base plate 52. The keyboard is operated to provide a pre-determined optical wavelength whereby the wavelength selector 82 via wavelength drive 28 selects this predetermined wavelength of operation for monochromator 26. At the same time the wavelength compensating network 83 is operated to select the potentiometer corresponding to the selected wavelength whereby flux signals from lock-in amplifier 74 are thereby wavelength compensated. Signals to the flux meter 88 are thus wavelength compensated. The SPV generated on the surface of the specimen 10 is coupled via the electrode 60a to the preamp 48 and thus through the lock-in amplifier 72 to meter 70 and to the servo 78 (FIG. 4). Potentiometer 98 is adjusted with switch 90 in the manual position 90b for a zero or balance reading of meter 104. Switch 90 is then operated to the servo position 90a. The output at terminal 92 is the servo control signal which at balance is zero volts. The apparatus is now in its operative state whereby the preselected value of d.c. SPV is indicated on meter 70 will be maintained to a substantially constant value with reference to the balance adjust voltage established by the potentiometer 98. The value of the d.c. SPV can be changed, if desired, by adjusting the potentiometer 77 with switch 90 in position 90b and again balancing with meter 104.

The reading of the flux I according to meter 88 is plotted on a graph as illustrated in FIG. 5. Assuming that the specimen 10 has a flux value I of 86 as shown in FIG. 5, point 106a is plotted against for example a look-up table value of 14.3 micrometers for the reciprocal absorption coefficient of silicon at the preselected value of 0.826 microns of the optical wavelength. A plurality of measurements is made each for a selected different wavelength. Each of such measurements provides a flux I which value is plotted as shown by the plurality of points 109. For example, a measurement at a wavelength for the largest reciprocal absorption coefficient and flux I is represented by plotted point 106b. Point 106b at a light flux of 181 is plotted against a reciprocal absorption value of 206 for a wavelength of 1.020 micrometers. The other points are for intermediate values. During the measurement at each different wavelength resulting in a different flux I, the preselected d.c. SPV is kept to a substantially constant value by the servo 78.

Furthermore, since the measurements at each of the selected wavelengths can be made rapidly in sequence, the effect of d.c. SPV drifting is reduced, if not minimized. In practice, a drift in the value of the light intensity I indicated by meter 88 necessary to maintain a constant magnitude d.c. SPV at a given wavelength should not be allowed to vary by more than about 3%. Possible inaccurate determinations of the diffusion length (L) may result if this drift value is exceeded. Such conditions may result from poor preparation of the semiconductor surface.

Servo 78 responds to any change in the d.c. SPV at terminal 91 to provide an output signal at output terminal 94a of amplifier 94 representing the amplified algebraic voltage difference with respect to the adjusted voltage of potentiometer 98. This difference voltage is further applied to amplifier 96 which prior to the change provided the control signal of zero volts at terminal 92 to control the lamp supply 79. The difference voltage effects a change in the control signal which when applied to lamp supply 79, increases or decreases the power to light source 20 thereby to increase or decrease the intensity of the light beam 22. The change in light beam 22 is such as to compensate for the change in the d.c. SPV to return the d.c. SPV thereby to the preselected value.

A line 107 is drawn through the plotted measurement points 106a . . . 106b and extended to the abscissa intersection point 108. The abscissa as known in the literature represents in this negative portion of the graph the diffusion length L in micrometers. See, for example, the ASTM F 391-78 article, paragraph 12. The value of 152 micrometers is determined for this exemplary plot as shown in FIG. 5. In a similar manner, the diffusion length L for other specimens can be determined.

It will now be appreciated that the apparatus of the invention functions to maintain the SPV constant. The apparatus of the invention assures that any change in sensitivity of the photodiode (40) at the selected wavelength is compensated by the wavelength compensator 83.

It should be further appreciated that the present invention solves the problem of determining the diffusion length in the presence of the drift of the amplitude of the SPV signal inherent in the prior art systems. The present invention provides for the means to measure and control to constancy the SPV. Also, the photon flux I required to maintain the constant magnitude of SPV is obtained and measured rapidly and is wavelength compensated. The requirement in the prior art of making measurements as quickly as possible as stated in the above-identified ASTM F 391-78, Paragraph 5.4 and thus achieved in the practice of this invention. Furthermore, the invention provides means for selecting a particular wavelength manually by a keyboard or button and, if desired, by a program implemented in a microprocessor or the like serving to select the wavelength according to a predetermined sequence. Moreover, the particular arrangement of the capacitive electrode completely illuminated by the monochromatic light reduces or minimizes the drift and provides a very good signal-to-noise ratio. By the arrangement of the capacitive electrode coupled in close proximity to the preamplifier still further improvement in the signal-to-noise ratio is achieved.

The invention is useful in a production facility of semiconductor devices that require many steps. As known in the art, many steps in the processing of such devices require the use of high temperature furnaces to effect particular fabrication steps. In such procedures the furnace environment may contaminate a batch of devices for one or more reasons including, but not limited to, lack of cleanliness, and contamination with heavy metals which act as lifetime killers. Such contaminations, if not discovered during the multiple processing of these devices, can result low yields. Accordingly, in the practice of the invention in such an environment, a specimen or sample material is placed in the furnace with the batch production devices. Any contamination of the devices during this furnace processing step will also contaminate the specimen material. The contamination will be manifested as an alteration or change in the diffusion length of that specimen. Accordingly, the invention lends itself to a means for a real-time monitoring technique for determining any contamination during the device processing.

What is claimed is:
1. An apparatus for determining the minority carrier diffusion length of a sample of semiconductor material, the sample having two major surfaces, one of the surfaces arranged for illumination and the other surface shielded from illumination comprising:
(a) means for illuminating a portion of the one major surface of the sample with periodically interrupted monochromatic light that is of a selected wavelength;
(b) means for providing a signal representing the surface photovoltage (SPV) on the sample generated in response to chopped monochromatic light;
(c) electronic servo means responsive to said SPV signal for automatically controlling the SPV signal to a substantially constant value; and
(d) means for providing a signal representing the illuminating intensity incident upon the sample.

2. An apparatus according to claim 1, wherein the SPV signal means includes a transparent capacitive pickup electrode positionable in the path of the light spaced from the illuminated portion of the sample and a conductive support plate adapted to receive the other surface of the sample, a first terminal connected to the capacitive electrode and a second terminal connected to the support plate, the SPV signal appearing between the first and second terminals.

3. An apparatus according to claim 2, wherein the capacitive electrode is generally planar extending parallel to the sample surface a given distance from the sample surface and having a protruding portion shaped to extend towards said sample surface a distance less than the given distance, the protruding portion having a given area, and wherein the illumating means includes a mask positioned over the capacitive electrode and having an aperture of at least the area of the capacitive electrode to pass the light through the protruding portion of the capacitive electrode onto the sample surface.

4. An apparatus according to claim 1, wherein the illuminating means includes a monochromator.

5. An apparatus according to claim 4, wherein the monochromator is a single grating monochromator.

6. An apparatus according to claim 4, wherein the monochromator is a double grating monochromator.

7. An apparatus according to claim 4, further including means for selecting the wavelength of light from the monochromator.

8. An apparatus according to claim 4, wherein the illuminating means includes a source of polychromatic light and means for adjusting the intensity of the polychromatic light to generate a predetermined magnitude of SPV signal.

9. An apparatus according to claim 8, further including an electronic servo loop for automatically adjusting the intensity of the polychromatic light in response to the SPV generated on the illuminated surface of the sample.

10. An apparatus according to claim 9, wherein the servo loop includes an amplifier having means to provide a control signal voltage having a magnitude and polarity to compensate for changes in the SPV signal from a predetermined value, the control voltage being coupled to the intensity adjusting means of the polychromatic light.

11. An apparatus according to claim 8, wherein the monochromatic light means includes light chopper means positioned between the polychromatic light source and the monochromator to provide the periodically interrupted light to the monochromator at a given frequency.

12. An apparatus according to claim 4, wherein the intensity signal means includes illumination intensity detecting means including a photodetector positioned to receive a portion of the monochromatic light at a given wavelength to generate an electrical signal representing the photon flux illuminating the sample.

13. An apparatus according to claim 12, wherein the photodetector has a response characteristic which depends upon the wavelength of light and further including means to compensate for the response characteristic of the photodetector for each selected wavelength of monochromatic light.

14. An apparatus according to claim 13, wherein said detecting means further includes a lock-in amplifier providing an output signal representing the illuminating intensity on the sample and means for synchronizing the amplifier with the periodically interrupted light.

15. An apparatus according to claim 7, wherein said wavelength selecting means includes manually operable key means for selecting a predetermined light wavelength.

16. An apparatus according to claim 7, wherein said wavelength selecting means includes a programmable computer arrayed to select a predetermined plurality of light wavelengths in a sequence to provide an illumination intensity signal for each wavelength of illuminating light.

17. A method for determining the minority carrier diffusion length of a sample of semiconductor material, the sample having two major surfaces, one of the surfaces arranged for illumination and the other surface shielded from illumination including the steps of:
(a) illumating a portion of the one major surface of the sample with periodically interrupted monochromatic light that is of a selected wavelength;
(b) providing a signal representing the surface photovoltage (SPV) on the sample generated in response to chopped monochromatic light;
(c) automatically controlling in an electronic servo means the SPV signal to a substantially constant value; and
(d) providing a signal representing the illuminating intensity incident upon the sample.

18. A method according to claim 17, wherein the SPV signal is provided by positioning in the path of the light a transparent capacitive pickup electrode spaced from the illuminated surface of the sample, and positioning a conductive support plate on the shielded surface of the sample, the SPV signal appearing between the transparent electrode and the support plate.

19. A method according to claim 18, comprising the step of selecting the wavelength of light with a monochromator.

20. A method according to claim 17, including the step of adjusting the intensity of the light to generate a predetermined magnitude of SPV signal.

21. A method according to claim 20, further including the step of automatically adjusting the intensity of the light in an electronic servo loop in response to the SPV generated on the illuminated surface of the sample.

22. A method according to claim 21, further including the step of providing in the servo loop a control signal voltage having a magnitude and polarity to compensate for changes in the SPV signal from a predetermined value, and using the control voltage to control the intensity of the light.

23. A method according to claim 20, comprising the step of chopping light.

24. A method according to claim 17, further including the step of detecting with a detector a portion of the light at a given wavelength to generate an electrical signal representing the photon flux illuminating the sample.

25. A method according to claim 24, further including the step of compensating at each selected wavelength of monochromatic light for the response characteristic of the detector that is wavelength dependent.

* * * * *